United States Patent
Ha et al.

(10) Patent No.: US 11,901,742 B2
(45) Date of Patent: Feb. 13, 2024

(54) WIRELESS OPTICAL CHARGING SYSTEM AND CHARGING METHOD THEREOF

(71) Applicant: Industry Academy Cooperation Foundation of Sejong University, Seoul (KR)

(72) Inventors: Jin Yong Ha, Seoul (KR); Jae Yeong Lim, Siheung-si (KR); Tariq Shamim Khwaja, Gwangju (KR)

(73) Assignee: Industry Academy Cooperation Foundation of Sejong University, Seoul (KR)

( * ) Notice: Subject to any disclaimer, the term of this patent is extended or adjusted under 35 U.S.C. 154(b) by 446 days.

(21) Appl. No.: 17/268,699

(22) PCT Filed: Mar. 3, 2020

(86) PCT No.: PCT/KR2020/002978
§ 371 (c)(1),
(2) Date: Feb. 16, 2021

(87) PCT Pub. No.: WO2020/242020
PCT Pub. Date: Dec. 3, 2020

(65) Prior Publication Data
US 2021/0234409 A1    Jul. 29, 2021

(30) Foreign Application Priority Data
May 24, 2019 (KR) .................. 10-2019-0061135

(51) Int. Cl.
*H02J 50/30* (2016.01)
*G02B 26/08* (2006.01)
*G02B 27/30* (2006.01)

(52) U.S. Cl.
CPC .......... *H02J 50/30* (2016.02); *G02B 26/0808* (2013.01); *G02B 26/0816* (2013.01); *G02B 27/30* (2013.01)

(58) Field of Classification Search
CPC ............... G02B 26/08; G02B 26/0808; G02B 26/0816; G02B 27/30; G02B 5/18;
(Continued)

(56) References Cited

U.S. PATENT DOCUMENTS 6,407,535 B1 *  6/2002  Friedman ............... B64D 41/00
                                                                    244/1 R
6,437,685 B2 *  8/2002  Hanaki ................... H02J 50/80
                                                                    340/5.1
(Continued)

FOREIGN PATENT DOCUMENTS

JP            4572754 B2      11/2010
JP         2017-216371 A      12/2017
(Continued)

OTHER PUBLICATIONS

Zhang, Qingqing, et al., "Adaptive Distributed Laser Charging for Efficient Wireless Power Transfer," *2017 IEEE 86th Vehicular Technology Conference (VTC-Fall)*, IEEE, 2017 (pp. 1-5).
(Continued)

*Primary Examiner* — John R Lee
(74) *Attorney, Agent, or Firm* — NSIP Law

(57) ABSTRACT

A wireless optical charging system according to the present invention includes a transmitter which transmits a laser beam as light with an energy increased by the resonance; and a receiving unit which receives light transmitted from the transmitter and converts an energy for some light among the received light into an electric energy to charge devices.
(Continued)

Accordingly, the laser resonance power transfer technology is used to solve the limitation of the distance and harmfulness to the human body.

22 Claims, 10 Drawing Sheets

(58) Field of Classification Search
CPC ......... G02F 1/01; G11B 7/0065; H01S 3/042; H01S 3/10; H01S 5/14; H01S 5/141; H02J 5/005; H02J 50/00; H02J 50/12; H02J 50/30; H02J 7/025
See application file for complete search history.

(56) References Cited

U.S. PATENT DOCUMENTS

| | | | | |
|---|---|---|---|---|
| 6,534,705 | B2* | 3/2003 | Berrios | F03H 3/00 |
| | | | | 323/221 |
| 6,633,026 | B2* | 10/2003 | Tuominen | H04B 10/807 |
| | | | | 250/214 R |
| 7,263,297 | B2* | 8/2007 | Verbana | H04B 10/1121 |
| | | | | 398/171 |
| 8,525,097 | B2* | 9/2013 | Alpert | H01S 3/083 |
| | | | | 250/221 |
| 8,835,823 | B2* | 9/2014 | Hyde | H02J 50/40 |
| | | | | 250/201.1 |
| 9,312,660 | B2* | 4/2016 | Alpert | H01S 3/005 |
| 10,587,152 | B2* | 3/2020 | Abiri | H02J 50/80 |
| 11,159,059 | B2* | 10/2021 | Gollakota | H02J 50/80 |
| 11,201,505 | B2* | 12/2021 | Mor | H02J 50/40 |
| 11,356,183 | B2* | 6/2022 | Golan | H04B 10/807 |
| 2004/0227057 | A1* | 11/2004 | Tuominen | H04B 10/807 |
| | | | | 250/221 |
| 2009/0103925 | A1* | 4/2009 | Alpert | H04B 10/807 |
| | | | | 398/130 |
| 2009/0213882 | A1* | 8/2009 | Weida | G01N 21/3504 |
| | | | | 372/29.011 |
| 2010/0012819 | A1* | 1/2010 | Graham | H04B 10/807 |
| | | | | 250/237 R |
| 2010/0079008 | A1* | 4/2010 | Hyde | H02J 50/80 |
| | | | | 250/201.1 |
| 2012/0235567 | A1* | 9/2012 | Karalis | H02J 7/0047 |
| | | | | 315/70 |
| 2013/0301057 | A1* | 11/2013 | Ha | H01S 5/141 |
| | | | | 356/497 |
| 2014/0126603 | A1* | 5/2014 | Della-Pergola | H01S 3/0604 |
| | | | | 372/96 |
| 2014/0333986 | A1 | 11/2014 | McCallion | |
| 2015/0015180 | A1* | 1/2015 | Miller | H02J 50/40 |
| | | | | 320/103 |
| 2017/0018976 | A1* | 1/2017 | Mor | H02J 50/40 |
| 2018/0123403 | A1* | 5/2018 | Kare | G01S 17/89 |
| 2019/0064353 | A1* | 2/2019 | Nugent, Jr. | H02J 50/60 |
| 2021/0234409 | A1* | 7/2021 | Ha | G02B 26/0808 |
| 2022/0103018 | A1* | 3/2022 | Mor | H04B 10/807 |

FOREIGN PATENT DOCUMENTS

| | | |
|---|---|---|
| JP | 2018-522421 A | 8/2018 |
| KR | 10-2009-0116464 A | 11/2009 |

OTHER PUBLICATIONS

Korean Office Action date Apr. 28, 2020 in counterpart Korean Patent Application No. 10-2019-0061135 (8 pages in Korean).
International Search Report dated Jun. 17, 2020 in counterpart International Patent Application No. PCT/KR2020/002978 (2 pages in English and 2 pages in Korean).
Written Opinion dated Jun. 17, 2020 in counterpart International Patent Application No. PCT/KR2020/002978 (7 pages in Korean).
Korean Notice of Allowance dated Oct. 14, 2020 in counterpart Korean Patent Application No. 10-2019-0061135 (8 pages in Korean).

* cited by examiner

1 Bidirectional & Free-space

3 Unidirectional & Free-space

2 Bidirectional & Fiber-based

4 Unidirectional & Fiber-based

WIRELESS OPTICAL CHARGING SYSTEM AND CHARGING METHOD THEREOF

CROSS REFERENCE TO RELATED APPLICATIONS

This application is a U.S. National Stage Application of International Application No. PCT/KR2020/002978, filed on Mar. 3, 2020, which claims the benefit under 35 USC 119(a) and 365(b) of Korean Patent Application No. 10-2019-0061135, filed on May 24, 2019, in the Korean Intellectual Property Office, the entire disclosures of which are incorporated herein by reference for all purposes.

TECHNICAL FIELD

The present invention relates to a wireless optical charging system and a charging method thereof, and more particularly, to a wireless optical charging system in which when a wavelength of a beam of a spatial light source is split and a retro-reflector which is a receiver is randomly located in a two-dimensional optical line, resonance occurs at only a wavelength at which optical paths match and a light power is transmitted and a charging method thereof.

BACKGROUND ART

A magnetic induction method which is the most currently commercialized wireless charging technology is a short-range charging method which requires close contact with a charger within 1 cm. However, a magnetic resonance method which is proposed to compensate for the magnetic induction method transmits magnetism to a matching frequency using a resonance frequency so that the charging may be performed even though it is not close to the charger and the charging is not interfered even though there is another object in the middle of the path to the charger. However, the magnetic resonance method has a problem in that the efficiency is sharply lowered if the distance is 1 m or more.

The other RF electromagnetic wave wireless charging method has a problem in that its application is limited due to the harmfulness of the electromagnetic wave.

In order to simultaneously charge a large number of fixed and mobile devices at a long-distance in a limited space, a new method other than currently developed methods is required.

DISCLOSURE

Technical Problem

Reflecting the above-described problems and circumstances, an object of the present invention is to provide a wireless optical charging system and a charging method thereof which are completely free from electrical power supply according to the existing methods and completely solve the problems of the battery charging of mobile devices such as consumer electronics and drones by developing a remote optical wireless charging technology which is harmless to a human body using IR light and a laser resonance technology, unlike the magnetic induction and the RF technology approach.

Technical Solution

In order to achieve the above-described objects, a wireless optical charging system according to the present invention includes a transmitter which transmits a wireless optical charging source (optical source) beam as light with an energy increased by resonance; and a receiving unit which receives light transmitted from the transmitter and converts an energy for some light among the received light into an electric energy to charge devices.

In order to achieve the above-described objects, the transmitter of the wireless optical charging system according to the present invention includes a light source unit; a diffraction grating, a prism, or an arrayed waveguide grating which divides light received from the light source unit into wavelengths in a predetermined range to output the light onto a space; and a collimator which is disposed between the light source unit and the diffraction grating to convert light output from the light source unit into a collimated ray.

In order to achieve the above-described objects, the transmitter of the wireless optical charging system according to the present invention further includes a direction control unit which receives output information of light output from the light source unit to control a direction of the diffraction grating. In order to achieve the above-described objects, the transmitter of the wireless optical charging system according to the present invention further includes a direction converting unit which is disposed at an output end of the diffraction grating to convert a direction of light output from the diffraction grating by being controlled by the direction control unit instead of the diffraction grating.

In order to achieve the above-described objects, the transmitter of the wireless optical charging system according to the present invention includes a light source unit; a width expansion unit which expands a width of light in order to increase reflectance of light of a retro-reflector of a receiver before light output from the light source unit is input to a diffraction grating; a diffraction grating which divides light received from the width expansion unit into wavelengths in a predetermined range to output the light onto a space; and a telescope which is formed at an output end of the diffraction grating to expand a FOV (field of view).

In order to achieve the above-described objects, the telescope of the wireless optical charging system according to the present invention includes a plurality of telescopes and some of the plurality of telescopes is configured to be disposed in parallel. In order to achieve the above-described objects, the light source unit of the wireless optical charging system according to the present invention includes a polarization maintaining optical fiber which maintains polarization of light; a semiconductor optical amplifier which is formed on a path of the polarization maintaining optical fiber to provide a broadband gain spectrum having a signal gain for the light; an isolator which transmits light only in one direction; and a coupler which receives a power from the collimator and outputs a broadband light source from the semiconductor optical amplifier to the diffraction grating.

In order to achieve the above-described objects, the light source unit of the wireless optical charging system according to the present invention includes a single mode optical fiber having one light propagation mode; a semiconductor optical amplifier which is formed on a path of the single mode optical fiber to provide a broadband gain spectrum having a signal gain for the light; an isolator which transmits light only in one direction; a polarization control unit which is formed at an input end and an output end of the semiconductor optical amplifier to maintain polarization of light; and a coupler which receives a power from the collimator and outputs a broadband light source from the semiconductor optical amplifier to the diffraction grating.

In order to achieve the above-described objects, the light source unit of the wireless optical charging system according to the present invention includes a single mode optical fiber having one light propagation mode; an optical fiber laser which is formed on a path of the single mode optical fiber so that an output is adjustable to output light in a broadband; a laser pump which adds light of an external source to the single mode optical fiber; a WDM coupler which couples a wavelength to light added from the laser pump and light of the single mode optical fiber; an isolator which transmits light only in one direction; a polarization control unit which is formed at an input end and an output end of the optical fiber laser to maintain polarization of light; and a coupler which receives a power from the collimator and outputs a broadband light source from the optical fiber laser to the diffraction grating.

In order to achieve the above-described objects, the light source unit of the wireless optical charging system according to the present invention includes a broadband pass filter which increases an optical signal to noise ratio (OSNR) of an optical signal incident by filtering light incident to the light source unit.

In order to achieve the above-described objects, the transmitter of the wireless optical charging system according to the present invention further includes a light splitter which is disposed at an output end of the light source unit to split light incident from the light source unit into two and transmit the light to the direction control unit and the diffraction grating, and the light source unit includes: a plurality of direction switching mirrors which switches a moving direction of light to form a moving path of light; a semiconductor optical amplifier which is formed on the moving path to provide a broadband gain spectrum having a signal gain for the light; an isolator which transmits light only in one direction of the moving path; and a collimator which is disposed between the semiconductor optical amplifier and the isolator to convert light output from the semiconductor optical amplifier into a collimated ray.

In order to achieve the above-described objects, the light source unit of the wireless optical charging system according to the present invention includes a single mode optical fiber having one light propagation mode; a semiconductor optical amplifier which is formed on a path of the single mode optical fiber to provide a broadband gain spectrum having a signal gain for the light; a polarization control unit which is formed at an input end and an output end of the semiconductor optical amplifier to maintain polarization of light; and a circulator which guides light to a tap coupler before the light output from an output port of the semiconductor optical amplifier goes to the collimator in a free space.

In order to achieve the above-described objects, the light source unit of the wireless optical charging system according to the present invention includes a bidirectional optical fiber in which resonance is bidirectionally performed; a coupler which outputs light moving in the bidirectional optical fiber at a predetermined ratio; a semiconductor optical amplifier which is formed at an output end of the coupler to provide a broadband gain spectrum having a signal gain for the light; and a polarization control unit which is formed on the path of the bidirectional optical fiber and formed at an output end of the semiconductor optical amplifier to maintain polarization of light.

In order to achieve the above-described objects, the light source unit of the wireless optical charging system according to the present invention includes a reflector on a free space which reflects incident light and increases an energy of light through a process of performing resonance; a semiconductor optical amplifier which provides a broadband gain spectrum having a signal gain for light which is reflected from the reflector to be incident; and a collimator which is disposed between the reflector and the semiconductor optical amplifier to convert output light into a collimated ray.

In order to achieve the above-described objects, in the wireless optical charging system according to the present invention, a plurality of semiconductor optical amplifiers is connected in parallel and couplers are disposed at nodes of an input end and an output end of the plurality of semiconductor optical amplifiers. In order to achieve the above-described objects, the width expansion unit of the wireless optical charging system according to the present invention includes a collimator which forms light transmitted from the light source unit into a collimated ray; a polarization film which adjusts polarization of light which is distorted on the space while being formed as a collimated ray by the collimator 121; and a beam expander which expands a width of light which maintains polarization as the collimated ray.

In order to achieve the above-described objects, the receiving unit of the wireless optical charging system according to the present invention includes a retro-reflector which reflects incident light at the same angle and is disposed in the form of a cube, and has a pitch formed at a center; and an energy converting unit which detects light among the incident light which is not reflected, but passes through the pitch at the center to convert the light into an electric energy.

In order to achieve the above-described objects, the receiving unit of the wireless optical charging system according to the present invention includes a broadband pass filter which increases an optical signal to noise ratio (OSNR) of an optical signal incident by filtering light incident to the receiving unit.

In order to achieve the above-described objects, the receiving unit of the wireless optical charging system according to the present invention includes a substrate which lowers reflectance of light which is incident to the receiving unit; a spherical ball lens which generates resonance on some wavelengths of light which is incident through the substrate; an optical diffuser which uniformly spatially disperses the light to be incident from the spherical ball lens; and a photovoltaic cell (PV cell) in which the converted electric energy is charged.

In order to achieve the above-described objects, the receiving unit of the wireless optical charging system according to the present invention includes an image sensor which is related to capturing of an image; a spherical ball lens which generates resonance on some wavelengths of incident light; and a relay unit which selectively transmits light incident to the receiving unit to the image sensor or the ball lens.

In order to achieve the above-described objects, the transmitter of the wireless optical charging system according to the present invention includes a light source unit; a light transfer mirror which transmits light received from the light source unit to the receiving unit; and a collimator which is disposed between the light source unit and the light transfer mirror to convert light output from the light source unit into a collimated ray.

In order to achieve the above-described objects, the transmitter of the wireless optical charging system according to the present invention further includes a receiving unit detecting module which detects the receiving unit which receives light generated from the light source unit; and a direction control unit which controls a direction of the light transfer mirror.

In order to achieve the above-described objects, the receiving unit detecting module of the wireless optical charging system according to the present invention includes a photographing unit which photographs a space; a receiving unit detecting unit which detects the receiving unit with LED light of the receiving unit 200 from an image photographed by the photographing unit in accordance with the driving; and a tracking signal generating unit which generates a tracking signal to allow the light transfer mirror by being controlled by the direction control unit to track a receiving unit detected by the unit detecting unit to transmit light.

Advantageous Effects

The wireless optical charging system according to the present invention divides a spatial wavelength of beams of light sources of semiconductor and optical fiber optical amplifiers by utilizing a laser resonance power transfer technology to transmit an optical power to a plurality of receivers over a long distance, thereby solving the distance limitation and a harmfulness to a human body.

BEST MODE

Hereinafter, a wireless optical charging system according to the present invention will be described in detail with reference to accompanying drawings.

Figure 1:
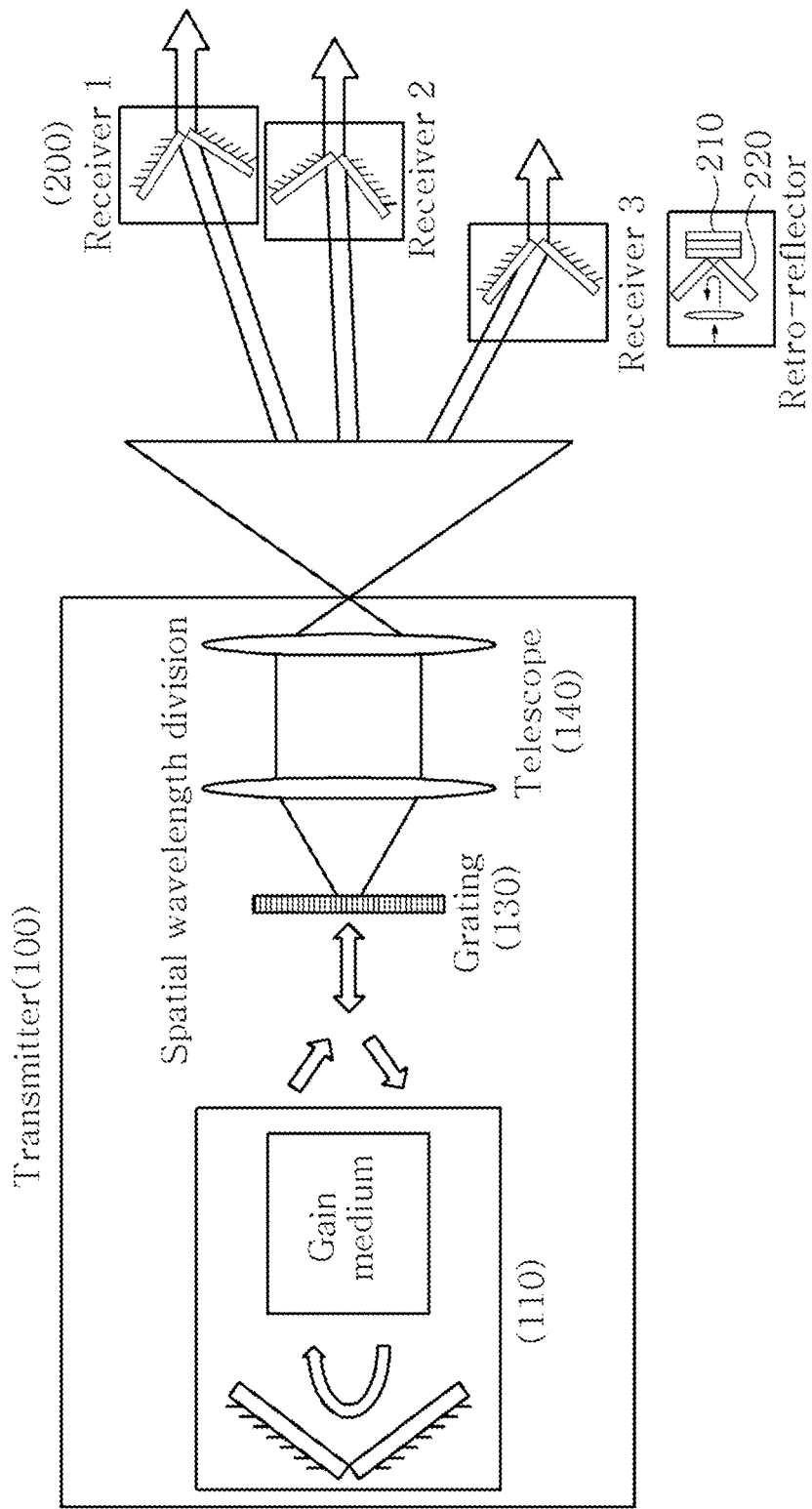
FIG. 1 is a diagram of a wireless optical charging system according to an exemplary embodiment of the present invention.

FIG. 1 is a diagram of a wireless optical charging system according to an exemplary embodiment of the present invention.

According to an exemplary embodiment, a wireless optical charging system according to the present invention may include a transmitter 100 and a plurality of receiving units 200. According to various exemplary embodiments, the transmitter 100 divides a wavelength of a light source beam and may transmit light with an energy which is increased by resonance with a receiver to the receiving unit 200.

According to an exemplary embodiment, the receiving unit 200 receives light transmitted from the transmitter 100 and converts partial light energy of the received light into an electric energy to charge devices. According to various exemplary embodiments, the transmitter 100 includes a light source unit 110, a diffraction grating 130, and a telescope 140.

According to an exemplary embodiment, the transmitter 100 may further include a width expansion unit 120 disposed at a front end of the diffraction grating 130, a direction changing unit 150 disposed at a rear end of the diffraction grating 130, and a direction control unit 160 which controls the direction of the direction changing unit 150 or the diffraction grating 130.

According to an exemplary embodiment, as the light is incident into the light source unit 110, the resonance is performed, and the energy of the light is increased. According to various exemplary embodiments, the light source unit 110 includes a gain medium which is applied with a power to generate light and may amplify a power of the corresponding light.

According to an exemplary embodiment, the light source unit 110 uses a bidirectional semiconductor optical amplifier (SOA, Innolume, SOA-1030-20-HI-40 dB) with a central wavelength of 1033.6 nm and a full width at half maximum of 21.9 nm so that a current of 800 mA is applied to the SOA to generate light and amplify a wavelength. According to various exemplary embodiments, the diffraction grating 130 spatially divides an SOA light source wavelength region of the light from the width expansion unit 120.

According to an exemplary embodiment, when the wavelength division method is a 1D division type, one diffraction grating 130 may be used and when the wavelength division method is a 2D division type, two diffraction gratings or a virtually imaged phase array (VIPA) and one diffraction grating 130 may be used. Hereinafter, $m\lambda = p(\sin\alpha + \sin\beta)$ is an equation representing a diffraction grating in which m refers to an order, p refers to a grating pitch, c refers to an incident angle to a diffraction grating, and $\beta$ refers to a diffraction angle.

In the exemplary embodiment disclosed in the present invention, a diffraction grating of 1200 grooves/mm is used. According to an exemplary embodiment disclosed in the present invention, when 16° is given as an incident angle of the light, an angle at which light spreads from the diffraction grating onto the space with a minimum wavelength and a maximum wavelength of a half width of the SOA may be known. According to an exemplary embodiment, since a linewidth of the SOA is very small, an angle at which light spreads onto the space may be small. According to various exemplary embodiments, light spreading in the space has an angle of 5.8° and may form collimated light at only one wavelength.

According to an exemplary embodiment, a channel linewidth may quantify a spectral purity of laser in a resonant cavity. According to various exemplary embodiments, the spectral purity may be limited by a resolving power R of the diffraction grating, which is given by the following Equation 1.

$$R = \frac{\lambda_c}{\delta\lambda} = mN \qquad \text{[Equation 1]}$$

In Equation 1, λc is a central wavelength of incident beam, δλ is a linewidth, N is a number of grooves illuminated by the beam, and m is an order of diffraction.

According to an exemplary embodiment, it may be inferred from Equation 1 that since there is a finite number of grooves in the diffraction grating, the line thickness may be limited. According to various exemplary embodiments, when a beam diameter $W_I$ of the incident beam is known, an illumination length $W_o$ may be calculated.

According to an exemplary embodiment, with a known grating pitch p, the number of grooves illuminated by a beam may be easily discovered. According to various exemplary embodiments, a linewidth of a channel defined by the following Equation 2 may be limited to a plane mirror or a retro-reflector which is placed far from the diffraction grating.

$$\delta\lambda = \frac{\lambda_c}{mN} = \frac{\lambda_c}{m}\left(\frac{p}{W_0}\right) = \frac{\sqrt{4\ln 2}}{\pi}\frac{\lambda_c}{m}\left(\frac{p\cos\sigma}{W_I}\right) \quad \text{[Equation 2]}$$

According to an exemplary embodiment, when a retro-reflector which replaces the above-described mirror is considered, a diverging angularly dispersed beam which strikes the retro-reflector may be redirected back to the cavity. According to various exemplary embodiments, as compared with the mirror, a wavelength in a broad range may be trapped in the cavity by the retro-reflector. The trapped wavelength may contribute to a broader channel linewidth. This contribution may be more apparent for short transmitter-receiver separation where multiple resonant lines compete for resonance.

According to an exemplary embodiment, light whose wavelength is divided from the diffraction grating 130 may have a small field of view (FOV). According to various exemplary embodiments, the telescope 140 is configured by two lenses, that is, a first lens and a second lens, to be used to control the field of view (FOV).

According to an exemplary embodiment, the control of the FOV may be a desirable characteristic that controls an area where the receiving unit 200 is disposed to allow the transmitter 100 of the wireless optical charging system according to the present invention to operate in a power transfer mode. According to various exemplary embodiments, the FOV imparted by the diffraction grating 130 is fixed by the spectrum of the gain medium and grating parameters and is not selected independently from the parameters. The FOV dependency on these parameters may be resolved by adding the telescope 140 including two lenses to the transmitter 100. The FOV which is imparted to a broadband incident light by the diffraction grating may be found by calculating a diffraction angle using the following Equation 3 which is a general diffraction equation.

$$\theta_d = \sin^{-1}\left(\frac{m\lambda_1}{p} - \sin\theta_i\right) \quad \text{[Equation 3]}$$

In Equation 3, $\lambda_1$ is a diffracted optical wavelength, p is a grating pitch, and $\theta_i$ and $\theta_d$ are angles created with respect to the normal of the diffraction grating by incident beam and diffracted beam, respectively.

When $\theta_{dmin}$ and $\theta_{dmax}$ define diffracted angles by the shortest wavelength $\lambda_{min}$ and the longest wavelength $\lambda_{max}$, respectively, FOV is $\theta_{dmax} - \theta_{dmin}$. That is, the SOA spectral bandwidth and the grating parameter may impose the limitation to the FOV.

According to an exemplary embodiment, in order to control the FOV without changing the SOA or the grating parameters, a lens telescope configuration may be used. According to various exemplary embodiments, light from a collimator may be collimated by a first lens. In a plane, spot sizes of the first lens and the second lens may be the same.

According to an exemplary embodiment, the FOV may be used by the following Equation using the first lens with a focal length of 200.0 mm and the second lens with a focal length of 75.0 mm $$f_1 \times \tan\left(\frac{\alpha}{2}\right) = f_2 \times \tan\left(\frac{\beta}{2}\right) \quad \text{[Equation 4]}$$

In Equation 4, $f_1$ is a focal length of the first lens, $f_2$ is a focal length of the second lens, α is an angle of light spreading from the diffraction grating, and β is a FOV which finally spreads in the space.

According to an exemplary embodiment, an angle β at which light finally spreads in the space may be larger than an angle α of light spreading from the diffraction grating. According to various exemplary embodiments, the FOV may be determined by the second lens. As a result, the dependence of the FOV is shifted from the selection of the diffraction grating or the SOA parameter to the selection of the second lens.

According to an exemplary embodiment, the second lens may be selected at a design stage and may be tuned in real time using a tunable focus lens to achieve a desired FOV. Although it has been described that the telescope has a two-lens configuration configured by the first lens and the second lens to improve the FOV, in order to further improve the FOV, four-lens configuration with two more lenses (a pair of telescopes) may also be used.

According to an exemplary embodiment, the direction control unit controls a direction of light which passes through the telescope based on a mirror to transmit the corresponding light to the receiving unit. According to various exemplary embodiments, the receiving unit may be a retro-reflection beam splitter which reflects a narrowband of light returning to the transmitter to complete a resonance channel which stimulates excitation of a light source therein.

According to an exemplary embodiment, the receiving unit may include various mobile devices or IoT sensor, a retro-reflector, and an energy converter in which charging needs to be performed. According to various exemplary embodiments, the receiving unit may be loaded in a mobile or fixed device to directly charge the loaded devices or separated to be fixed in a specific location and then charge the separated devices in a wired or wireless manner by a separate mechanism.

According to an exemplary embodiment, the retro-reflector serves to reflect incident light at the same angle and is disposed with a cube shape. An interval of the center cells may be 4 mm According to various exemplary embodiments, the receiving unit may transmit a part of a power of a light source to a device which needs a power in accordance with a power split ratio of the retro-reflector.

According to an exemplary embodiment, the retro-reflector of the receiving unit reverses the direction of the optical beam to an incident trajectory regardless of the incident angle so that the alignment may be easy. According to various exemplary embodiments, a corner cube or a ball lens type spherical retro-reflector which reversely reflects only a part of the beam and transmits approximately 80% of the beam may be available as the retro-reflector of the receiving unit.

According to an exemplary embodiment, the retro-reflector may use a micro ball lens array, that is, a plurality of ball lens which is disposed in a line. According to various exemplary embodiments, when the beam which is incident into the retro-reflector has a negligible spot size, the reflected beam may be reflected to be parallel to the incident path without retracing the incident path.

According to an exemplary embodiment, it may be difficult to set a self-alignment mechanism between the transmitter and the receiving unit. For example, when the beam is not self-aligned, it will not couple back into the transmitter module, but a broken cavity may be generated.

According to an exemplary embodiment, when a spot size of the incident beam is similar to a pitch of the retro-reflector, the generation of a broken cavity may be mitigated. According to various exemplary embodiments, when the spot size is increased, the self-alignment may be increased, but the self-alignment efficiency may be determined depending on the incident angle. For example, a power efficiency of the retro-reflector is reduced in accordance with the increase of the incident angle and depends on an acceptance angle of the retro-reflector.

According to an exemplary embodiment, when a high power is incident into the retro-reflector, there may be a problem in that a temperature of the cell increases. Accordingly, in order to solve the problem, an optical diffuser is disposed after the retro-reflector to uniformly spatially divide and disperse the light to be incident into the cell. According to various exemplary embodiments, the optical diffuser uniformly disperses the light on the entire surface to minimize or remove a high intensity bright spot.

According to an exemplary embodiment, the energy converting unit detects light which passes through a pitch of the center cell without being reflected, among the incident light, to convert the light into an electric energy. According to various exemplary embodiments, the energy converting unit includes a solar cell or a photovoltaic cell to detect light which passes through the pitch of the center cell and then converts the energy of corresponding light into an electric energy and may charge the receiving unit with the corresponding electric energy.

Figure 2:
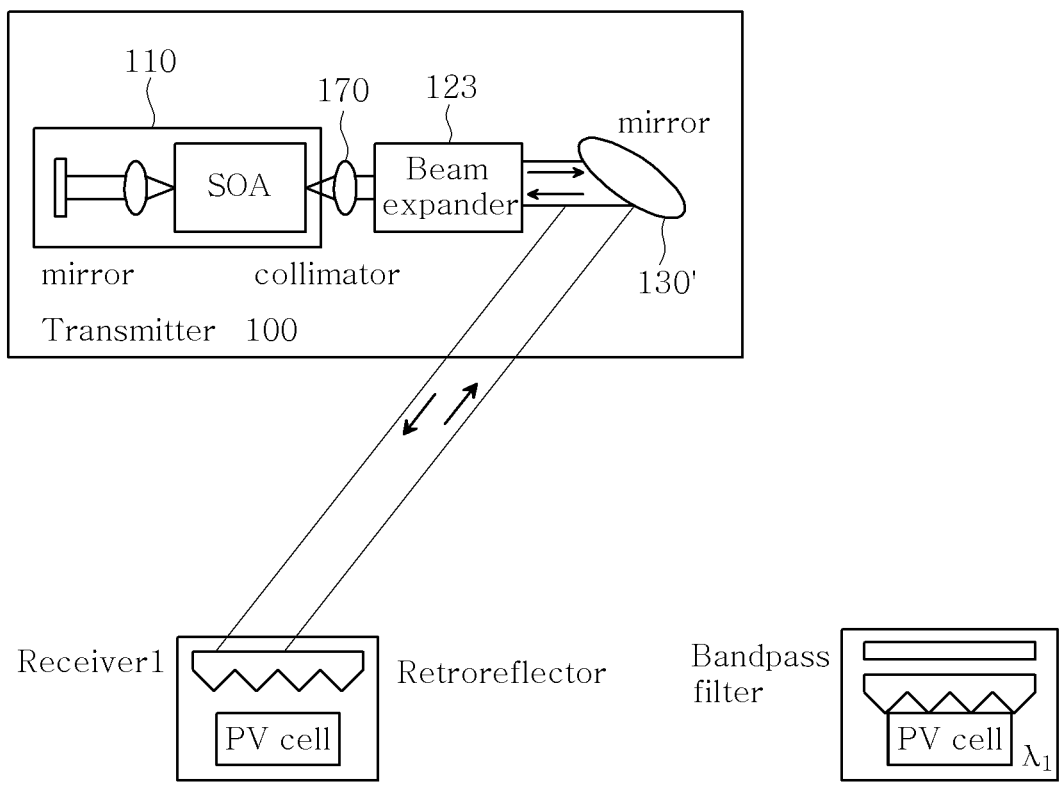
FIG. 2 is a view illustrating a wireless optical charging system according to a first exemplary embodiment of the present invention.

FIG. 2 is a view illustrating a wireless optical charging system according to a first exemplary embodiment of the present invention. To be more specific, FIG. 2 is a wireless optical charging system using a light transfer mirror 130'.

According to an exemplary embodiment, the transmitter 100 of the wireless optical charging system includes a light source unit 110, a light transfer mirror 130', and a collimator 170. According to various exemplary embodiments, as the light is incident onto the light source unit 110, the light source unit increases an energy of the light through the resonance to output the light.

According to an exemplary embodiment, the light transfer mirror 130' is disposed at an output end of the light source unit 110 to transmit all the light output from the light source unit 110 to the receiving unit. According to various exemplary embodiments, the collimator 170 is disposed between the light source unit 110 and the light transfer mirror 130' to convert light output from the light source unit 110 into a collimated ray.

According to an exemplary embodiment, the transmitter 100 of the wireless optical charging system may expand a limited field of view (FOV) of the beam through x,y control of the light transfer mirror 130' and beam steering by utilizing an SLM, a DMD, an MEMS, and a small mirror, instead of the diffraction grating. According to various exemplary embodiments, when the light transfer mirror 130' is used in the transmitter 100 of the wireless optical charging system, instead of the diffraction grating, the receiving unit may include a bandpass filter which detects and receives only a signal in a specific wavelength band.

According to an exemplary embodiment, a beam expander 123 which expands and extends a width of the light may be disposed between the collimator 170 and the light transfer mirror 130'. According to various exemplary embodiments, the light source unit 110 may include various types of semiconductor optical amplifiers (SOA). For example, the light source unit 110 may also include a doped fiber amplifier or a solid-state optical amplifier. In the meantime, according to the present invention, various types of optical amplifiers other than the SOA may be included in the light source unit 110.

According to an exemplary embodiment, the doped fiber amplifier may include Erbium or Ytterbium doped fiber amplifier (EDFA or YBFA). The various types of SOAs will be described below with the description of FIG. 6. For example, a unidirectional lasing structure and a bidirectional lasing structure which utilize an optical amplifier, an optical fiber based or free space based optical coupling structure may be considered.

According to an exemplary embodiment, the light source unit 110 may include an optical bandpass filter which filters light incident into the receiving unit to increase an incident optical signal to noise ratio (OSNR). According to various exemplary embodiments, the optical bandpass filter may also be included in the transmitter 100 or the receiving unit.

Figure 3:
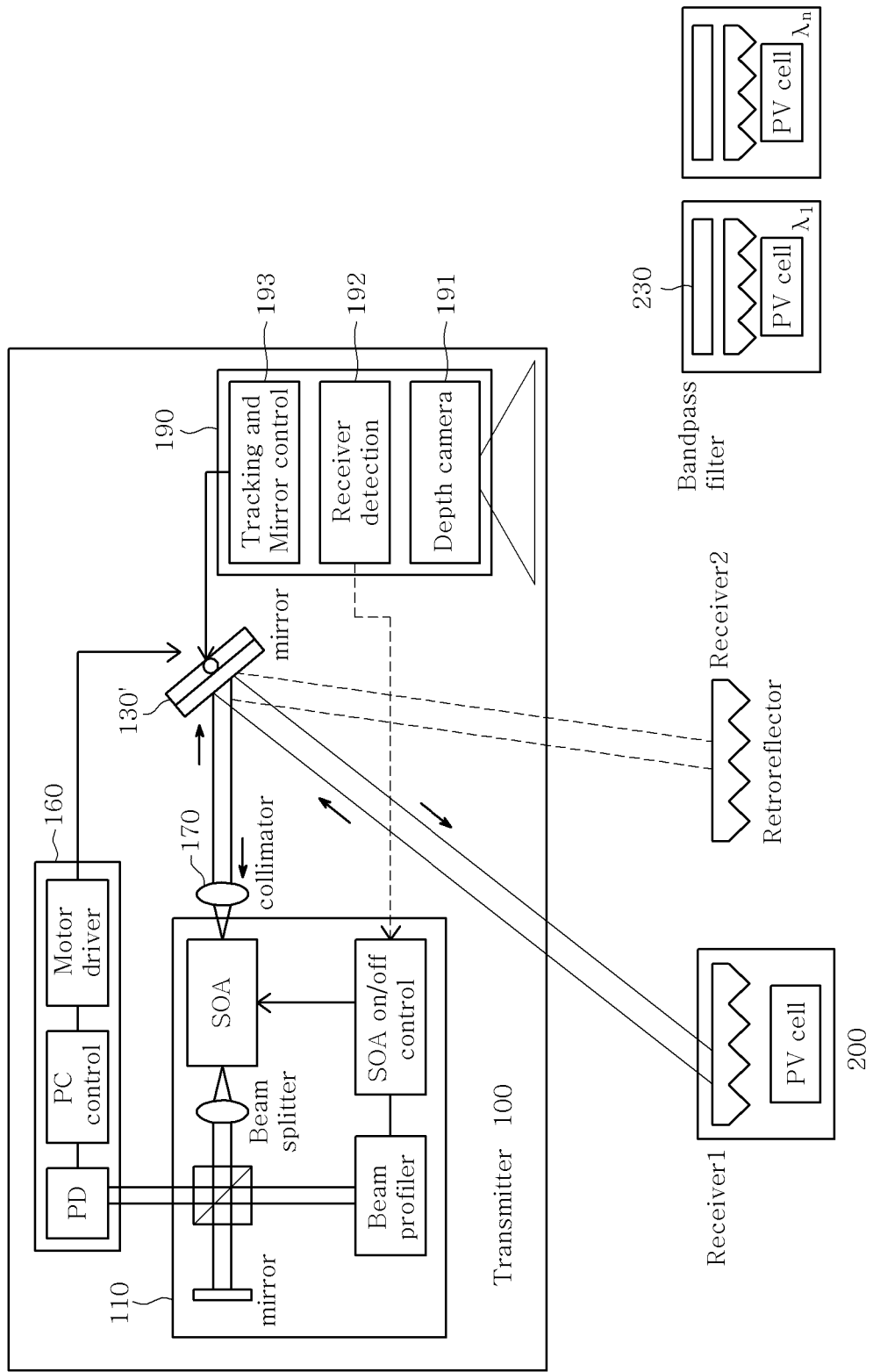
FIG. 3 is a view illustrating a wireless optical charging system according to a second exemplary embodiment of the present invention.

FIG. 3 is a view illustrating a wireless optical charging system according to a second exemplary embodiment of the present invention.

According to an exemplary embodiment, the transmitter 100 may include a receiving unit detecting module 190 and a direction control unit 160. According to various exemplary embodiments, the receiving unit detecting module 190 may detect a receiving unit 200 in a space where the light of the transmitter 100 is output.

According to an exemplary embodiment, the receiving unit detecting module 190 may include a photographing unit 191, a receiving unit detecting unit 192, and a tracking signal generating unit 193. According to various exemplary embodiments, the photographing unit 191 is a configuration corresponding to a depth camera or a CCD camera and may photograph a space where the transmitter 100 output light.

According to an exemplary embodiment, the receiving unit detecting unit 192 may detect the receiving unit 200 with LED light of the operating receiving unit 200 from an image photographed by the photographing unit 191 or detect the receiving unit by machine learning based image analysis. According to various exemplary embodiments, the tracking signal generating unit 193 may generate a tracking signal which allows the light transfer mirror 130' by being controlled by the direction control unit 160 to track the receiving unit 200 detected by a unit detecting unit 192 and transmit the light thereto.

That is, when the tracking signal generated by the tracking signal generating unit 193 is transmitted to the direction control unit 160 which controls the direction of the light transfer mirror 130', the direction control unit 160 may control the direction to allow the light transfer mirror 130' to transmit the light toward the receiving unit detected by the receiving unit detecting unit 192.

According to an exemplary embodiment, the tracking signal generating unit 193 may check a charging state by a brightness of LED light formed in the receiving unit 200. That is, when the LED light is bright, the tracking signal generating unit 193 confirms that the charging state is good and when the LED light is dark, the tracking signal generating unit 193 confirms that the charging state is bad. According to various exemplary embodiments, the charging state of the receiving unit 200 may be confirmed by the Bluetooth communication of a portable terminal.

According to an exemplary embodiment, the tracking signal generating unit 193 checks the charging state of the receiving unit 200 to generate a tracking signal to charge a receiving unit 200 whose charging state is bad first. According to various exemplary embodiments, the receiving unit detecting module 190 checks the charging state to control the beam steering and then may control beam steering to detect a maximum power.

According to an exemplary embodiment, a beam expander may be disposed between the collimator 170 and the light transfer mirror 130' to expand a width of the light so that the light with an expanded width is incident into the light transfer mirror 130'. According to various exemplary embodiments, a diffraction grating which disperses the light to expand the width of the light may be disposed between the collimator 170 and the light transfer mirror 130'.

According to an exemplary embodiment, the direction control unit 160 may include an output information receiver PD, an analysis unit (PC control) and a motor driver. According to various exemplary embodiments, the output information receiver is connected to the light source unit 110 to receive output information of the light source, the analysis unit analyzes the output information, and the motor driver may control the direction of the light transfer mirror 130' with the analyzed output information.

According to an exemplary embodiment, in the light transfer mirror 130', one mirror may supply the power to a plurality of receiving units or a plurality of mirrors may supply the power to a plurality of receiving units with a bandpass filter 230 having different central wavelengths. According to various exemplary embodiments, the direction control unit 160 may receive a direction control signal to control the direction of the light transfer mirror 130'.

According to an exemplary embodiment, the light source unit 110 may generate resonance on the incident light in at least one direction to amplify the light energy. Although in FIG. 2, it is illustrated that the resonance is generated by the light source unit 110 in one direction, depending on the exemplary embodiment, the number of directions in which the resonance is generated may be increased. A configuration of the light source unit in accordance with the number of resonance directions will be described below with reference to FIG. 6.

According to an exemplary embodiment, when the light transfer mirror 130' is used in the transmitter 100 of the wireless optical charging system, the receiving unit 200 may include a bandpass filter 230 so as to detect and receive only a signal in a specific wavelength band.

In the meantime, even though it is not illustrated in the drawing, according to an exemplary embodiment, the receiving unit 200 may include a spherical ball lens which generates the resonance for some wavelengths of incident light and a PV cell to which a converted electric energy is charged, for additional charging. According to various exemplary embodiments, in the receiving unit 200, a glass substrate or a plastic substrate which lowers a reflectance of light incident into the receiving unit may be disposed at an upper end of the ball lens.

Figure 4:
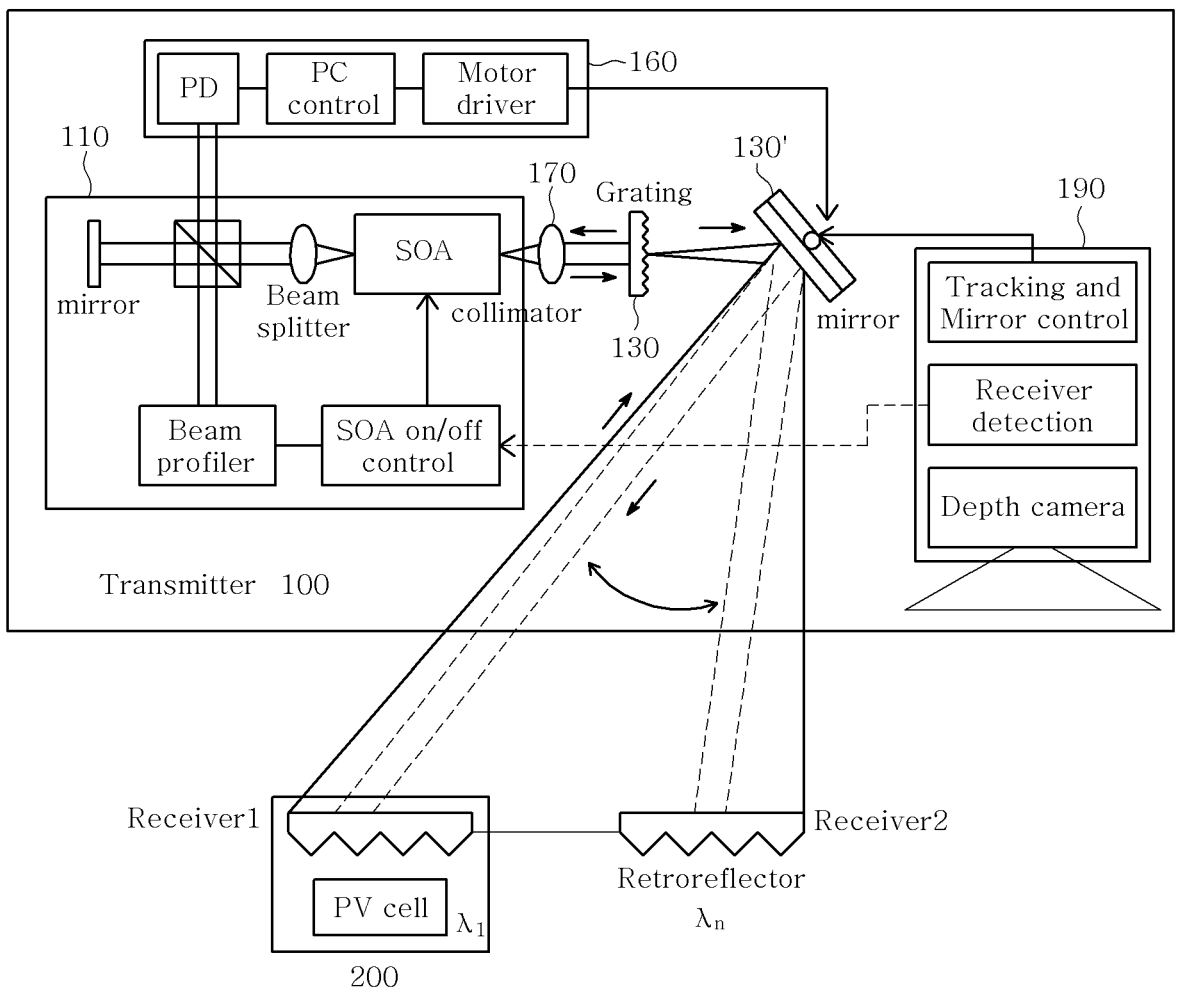
FIG. 4 is a view illustrating a wireless optical charging system according to a third exemplary embodiment of the present invention.

FIG. 4 is a view illustrating a wireless optical charging system according to a third exemplary embodiment of the present invention.

A configuration of a transmitter 100 illustrated in FIG. 4 may be similar to a configuration of the transmitter 100 illustrated in FIG. 3. According to an exemplary embodiment, a light source unit 110, a direction control unit 160, a collimator 170, a light transfer mirror 130', and a receiving unit detecting module 190 of FIG. 4 may perform the same or similar operation to the configurations illustrated in FIG. 3.

According to an exemplary embodiment, the transmitter 100 of FIG. 4 may include a diffraction grating 130 between the collimator 170 and the light transfer mirror 130'. According to various exemplary embodiments, the diffraction grating divides light transmitted from the light source unit 110 into wavelengths in an SOA light source wavelength range to output the light onto the space.

In the meantime, the configuration of the transmitter 100 in the wireless optical charging system according to a fourth exemplary embodiment of the present invention may be similar to the configuration of the transmitter 100 illustrated in FIG. 3. According to an exemplary embodiment, a light source unit 110, a direction control unit 160, a collimator 170, and a receiving unit detecting module 190 which configure the wireless optical charging system according to the fourth exemplary embodiment may perform the same or similar operation to the configurations illustrated in FIG. 3.

According to an exemplary embodiment, the transmitter which configures the wireless optical charging system according to the fourth exemplary embodiment may be configured by replacing the light transfer mirror 130' among the configurations of the transmitter 100 of FIG. 3 with the diffraction grating 130. According to various exemplary embodiments, the direction control unit 160 receives output information of a light source output from the light source unit 110 to control the direction of the diffraction grating 130.

According to an exemplary embodiment, the motor driver which configures the direction control unit 160 may control the direction of the diffraction grating 130 with the analyzed output information. According to various exemplary embodiments, the diffraction grating 130 divides light transmitted from the light source unit 110 into wavelengths in an SOA light source wavelength range to output the light onto the space while being controlled by the direction control unit 160 to change a direction.

According to an exemplary embodiment, in the case of 1D division of light, one diffraction grating 130 is used and the direction control of the diffraction grating 130 by the direction control unit 160 may be additionally applied. According to various exemplary embodiments, in the case of 2D division of light, in a state in which a virtually imaged phase array VIPA and one diffraction grating 130 are used to implement the wavelength division, additionally the direction control of the diffraction grating 130 by the direction control unit 160 may be applied.

According to an exemplary embodiment, the collimator 170 is disposed between the light source unit 110 and the diffraction grating 130 to convert light output from the light source unit 110 into a collimated ray and transmit the collimated ray to the diffraction grating 130.

Figure 5:
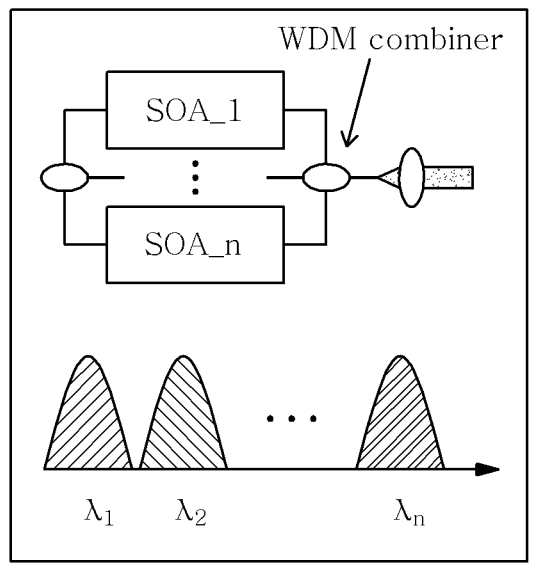
FIG. 5 is a view illustrating an example that a plurality of SOA light sources is used according to an exemplary embodiment of the present invention.
Figure 5:
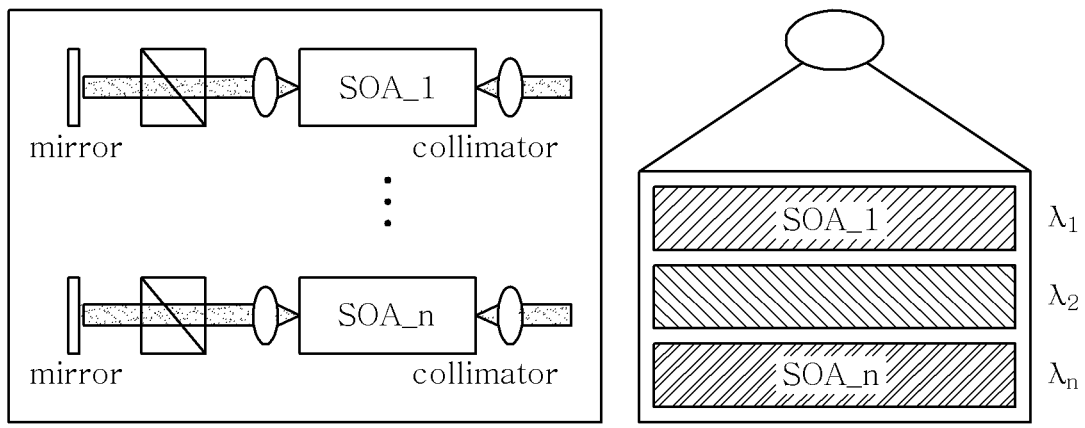
Figure 5:
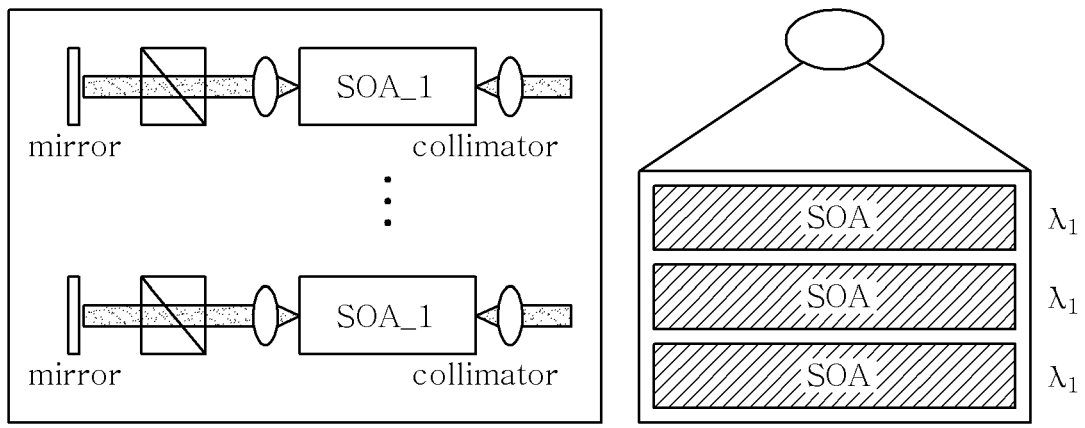

FIG. 5 is a view illustrating an example that a plurality of SOA light sources is used according to an exemplary embodiment of the present invention.

According to an exemplary embodiment, the light source unit may include a plurality of SOAs as illustrated in FIG. 5. According to various exemplary embodiments, the plurality of SOAs may correspond to the same wavelength band or different wavelength bands. For example, SOA 1 may generate light with a wavelength corresponding to a first band $\lambda_1$, SOA 2 may generate light with a wavelength corresponding to a second band $\lambda_2$, and, SOA n may generate light with a wavelength corresponding to an n-th band $\lambda_n$.

According to an exemplary embodiment, a light source unit including a plurality of SOAs with different wavelength bands is configured to expand the FOV of the transmitter.

Figure 6:
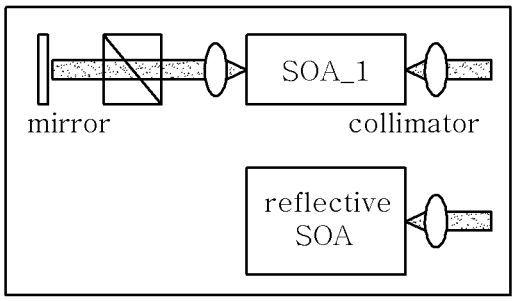
FIG. 6 is a view illustrating a changeable structure of a light source unit according to an exemplary embodiment of the present invention.
Figure 6:
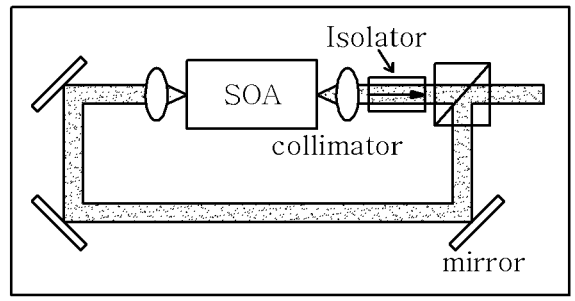
Figure 6:
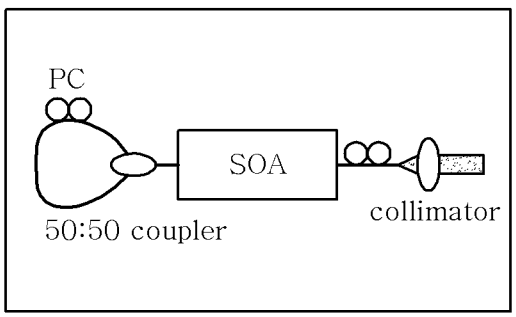
Figure 6:
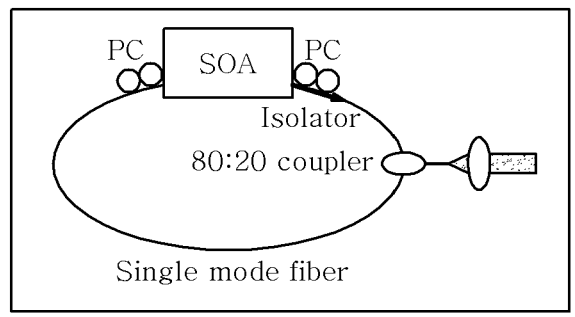

FIG. 6 is a view illustrating a changeable structure of a light source unit according to an exemplary embodiment of the present invention.

According to an exemplary embodiment, a structure of the light source unit may vary depending on a direction in which the resonance is generated in the light source unit, that is, depending on whether to bidirectionally or unidirectionally pass through the SOA. For example, the light source unit includes one mirror, one SOA, and at least one collimator to generate resonance in one bi-direction on a free space. According to various exemplary embodiments, the light source unit includes one reflective SOA (RSOA) or a vertical cavity SOA (VCSOA) and one collimator so that the resonance may be generated in one bi-direction on the free space.

According to an exemplary embodiment, the light source unit may include a bidirectional optical fiber. According to various exemplary embodiments, the light source unit may include a bidirectional optical fiber, a coupler, an SOA, and a collimator and the bidirectional optical fiber bidirectionally generates the resonance on the incident light to amplify the light energy. For example, the light source unit including the bidirectional optical fiber may cause the resonance along the optical fiber in two bi-directions.

According to an exemplary embodiment, the coupler outputs the light which moves in the bidirectional optical fiber at a predetermined rate and the SOA is formed at an output end of the coupler to provide a broadband gain spectrum with a signal gain for the light. According to various exemplary embodiments, the collimator is formed on a path of the bidirectional optical fiber and is formed at an output end of the SOA to maintain the polarization of the light.

According to an exemplary embodiment, the light source unit may include a plurality of direction switching mirrors which switches a moving direction of the light at a corner portion, instead of the optical fiber. According to various exemplary embodiments, the collimator is disposed between the SOA of the light source unit and an isolator to convert the light output from the SOA into a collimated ray. The light source unit includes a plurality of direction switching mirrors, the SOA, the collimator, and the isolator to generate the resonance on the free space to transmit and receive light for charging to and from the plurality of receivers.

According to an exemplary embodiment, the light source unit may include a light splitter. According to various exemplary embodiments, the light splitter is disposed at an output end of the light source unit to split the light incident from the light source unit in at least two directions.

According to an exemplary embodiment, the light source unit may include a polarization maintaining optical fiber, an SOA, an isolator, and a coupler. According to various exemplary embodiments, light in which a direction of an electric field is constant on an arbitrary plane perpendicular to a traveling direction is referred to as polarization and the polarization maintaining optical fiber may allow the light with the input power to move while maintaining the polarization. The light source unit includes the polarization maintaining optical fiber, the SOA, the isolator, and the coupler so that the resonance may be generated.

According to an exemplary embodiment, the SOA may provide a broadband gain spectrum with a high signal gain for the light. According to various exemplary embodiments, the SOA is included in the light source unit so that the light source unit may be made compact and multi-wavelength may be implemented using a broadband light source.

According to an exemplary embodiment, the isolator allows the light source to be transmitted only in one direction to stabilize and enhance the performance of the transmitter. According to various exemplary embodiments, the coupler receives the power from the collimator to output and transmit the broadband light source from the SOA.

According to an exemplary embodiment, the isolator and the coupler may be replaced with a circulator. That is, instead of the isolator and the coupler included in the light source unit as mentioned above, a circulator may be applied.

According to an exemplary embodiment, in order to implement a light source unit at a low cost, except for the above-mentioned circulator or isolator, only a coupler with 99:1 or 90:10 or other split ratio may be implemented.

Figure 7:
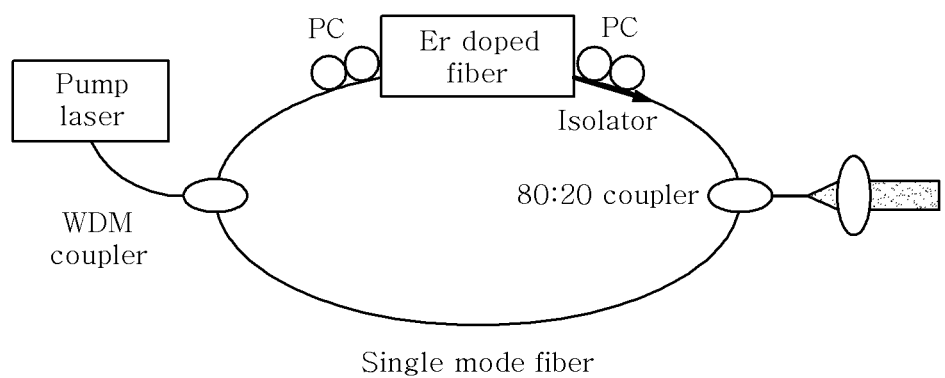
FIG. 7 is a view illustrating an example that an optical fiber laser is included in a light source unit according to an exemplary embodiment of the present invention.

FIG. 7 is a view illustrating an example that an optical fiber amplifier is included in a light source unit according to an exemplary embodiment of the present invention.

According to an exemplary embodiment, the light source unit may include an optical fiber amplifier instead of the SOA. According to various exemplary embodiments, the optical fiber amplifier is an optical fiber amplifier in which a low level rare earth halide is added to a medium so that the output may be adjusted over a broad range. Therefore, the light may be output in a broadband. For example, the optical fiber laser may be configured by Erbium or Ytterbium doped fiber.

According to an exemplary embodiment, as the light source unit includes an optical fiber amplifier instead of the SOA, the light source unit may further include a pump laser and a WDM coupler. According to various exemplary embodiments, the pump laser adds a small number of external light to a single mode optical fiber and the WDM coupler may couple a wavelength to light added from the pump laser and light of a single mode optical fiber. In the meantime, as mentioned in the description of FIG. 6, the isolator and the coupler illustrated in FIG. 7 may also be replaced with the circulator.

Figure 8:
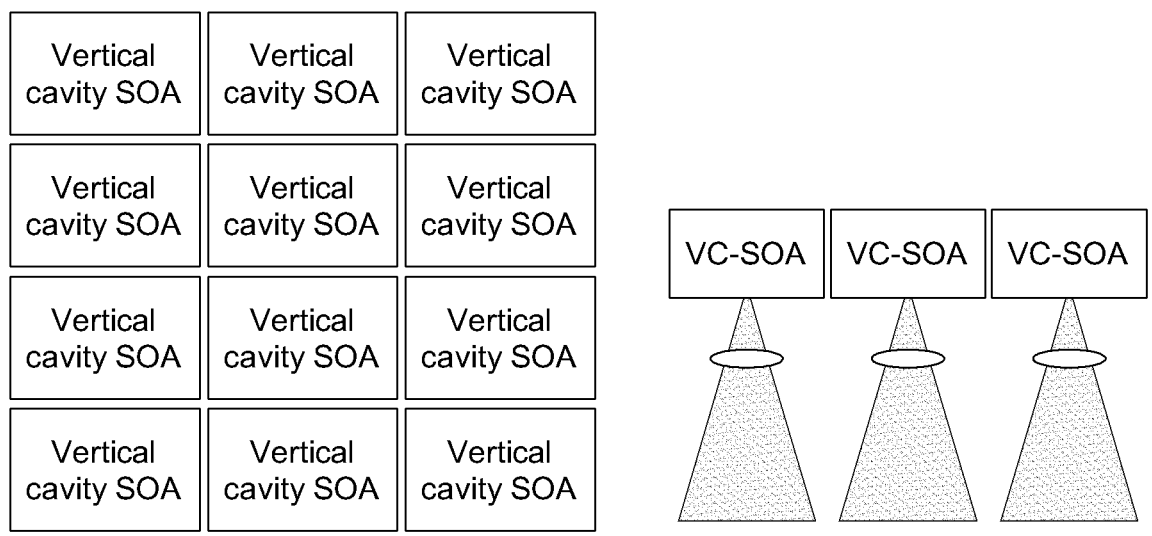
FIG. 8 is a view illustrating an example that a light source unit is configured by a vertical cavity SOA according to an exemplary embodiment of the present invention.

FIG. 8 is a view illustrating an example that a light source unit is configured by a vertical cavity SOA according to an exemplary embodiment of the present invention.

According to an exemplary embodiment, in the light source unit, as illustrated in FIG. 8, a plurality of vertical cavity SOAs may be configured in the form of an array. According to various exemplary embodiments, when the light source unit is configured by a vertical cavity SOA, the light may be output from a laminated surface of the SOA.

According to an exemplary embodiment, the vertical cavity SOA may be similar to a vertical cavity surface emitting laser. However, a reflectance of an upper mirror of the vertical cavity SOA may be lower than a reflectance of an upper mirror of the vertical cavity surface emitting laser so as not to reach a laser threshold value.

According to an exemplary embodiment, in the case of the vertical cavity SOA, not only a single pass gain through a small number of quantum wells is lowered, but also the gain bandwidth may be substantially reduced. Accordingly, in order to achieve a high gain through the vertical cavity SOA, a high upper reflectance may be required. According to various exemplary embodiments, the vertical cavity SOA may be manufactured with a smaller size than the other SOAs and may have a low driving current. Further, the vertical cavity SOA has advantages in that it is cheaper than the other SOAs and the SOA manufacturing process is easy.

Figure 9:
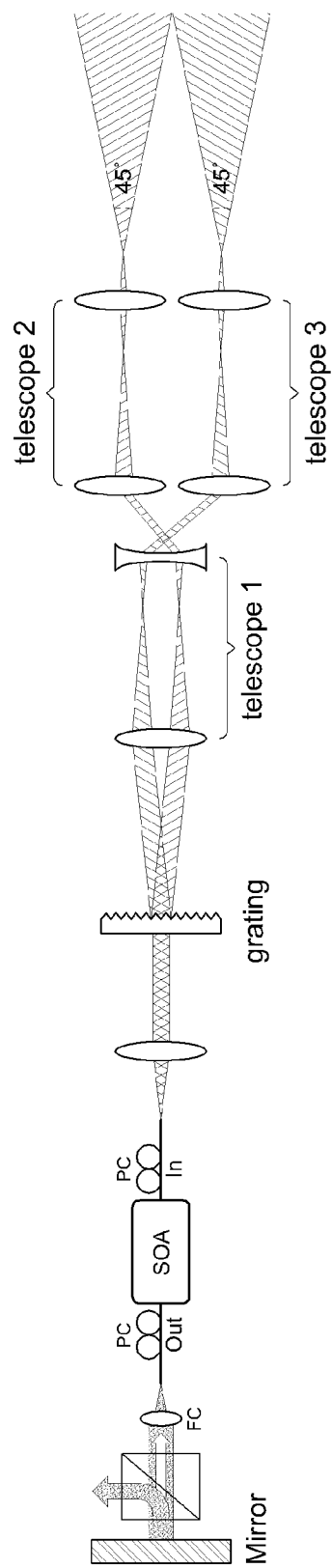
FIG. 9 is a view illustrating an example that a plurality of telescopes is disposed in parallel according to an exemplary embodiment of the present invention.

FIG. 9 is a view illustrating an example that a plurality of telescopes is disposed in parallel according to an exemplary embodiment of the present invention. According to an exemplary embodiment, light whose wavelength is divided from the diffraction grating has a small FOV and is incident into the telescope. According to various exemplary embodiments, an FOV of ±45° (that is, 90°) may not be obtained through one telescope due to an aberration. Accordingly, in order to solve this problem, as illustrated in FIG. 9, the telescope may be configured by a plurality of telescopes.

According to an exemplary embodiment, as illustrated in FIG. 9, the telescope may be configured by three telescopes (telescope 1, telescope 2, and telescope 3) and two telescopes (telescope 2 and telescope 3) among three telescopes are disposed in parallel so that an angle of light which finally spreads into the space may be larger than an angle of light which spreads through the diffraction grating.

According to an exemplary embodiment, each of the plurality of telescopes which configures the present invention may include a first lens to which the light is incident and a second lens which outputs the light passing through the first lens onto the space. According to various exemplary embodiments, in a center portion of the second lens of each of the telescopes (telescope 2 and telescope 3) which are disposed in parallel, a shielding unit which blocks a part of light passing through the second lens may be formed.

According to an exemplary embodiment, light with a high power which is harmful to a human body may be transmitted through the transmitter due to reflection of light which is incident perpendicularly to the diffraction grating or a lens (including a first lens and a second lens). For example, even not in a power transfer mode in which power is transmitted by the resonance, light with a high power which is harmful to the human body may be transmitted through the transmitter. According to various exemplary embodiments, the shielding unit may remove a resonant signal caused by a signal reflected from a lens center in the bidirectional lasing cavity.

Figure 10A:
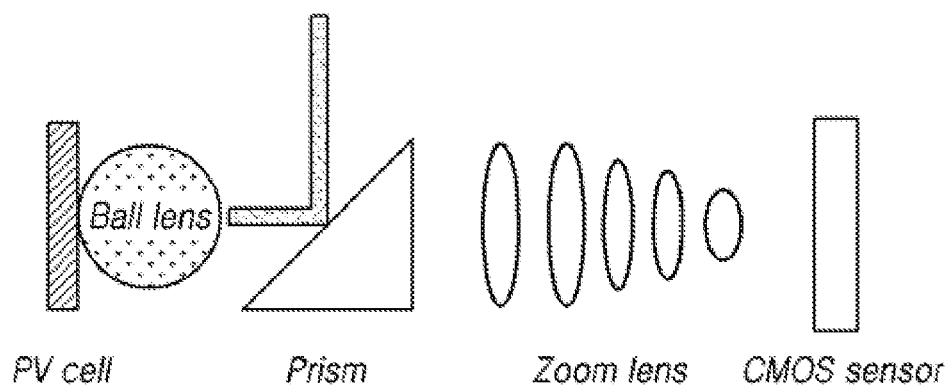
FIGS. 10A and 10B are views illustrating a structure of a receiving unit of a cellular phone according to an exemplary embodiment of the present invention.
Figure 10B:
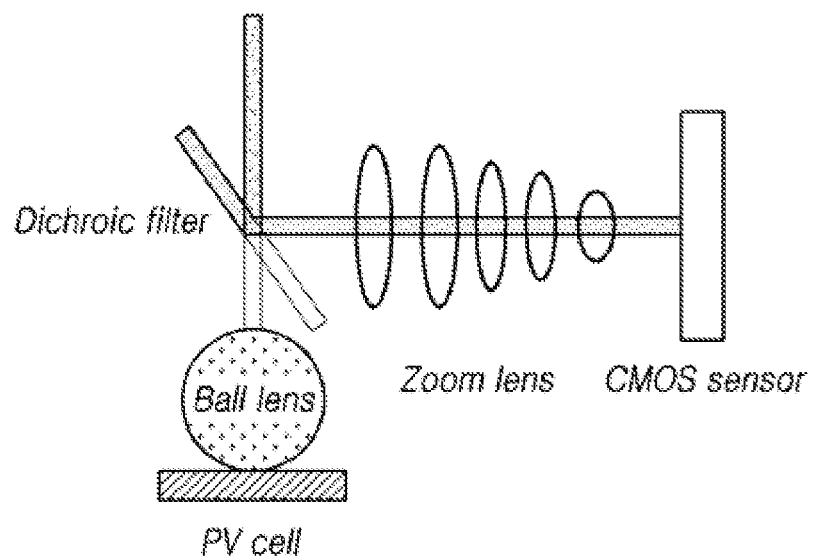

FIGS. 10A and 10B are views illustrating a structure of a receiving unit of a cellular phone according to an exemplary embodiment of the present invention.

According to an exemplary embodiment, the receiving unit may include an image sensor (CMOS sensor) related to image capturing, a spherical ball lens which generates resonance for some wavelengths of incident light, and a relay unit which selectively transmits light incident into the receiving unit to the image sensor or the ball lens. According to various exemplary embodiments, the receiving unit controls the relay unit if necessary to transmit the received light to the image sensor when the image capturing is required and transmit the received light to the ball lens when the charging of the PV cell is requested.

According to an embodiment, the relay unit may be configured using a prism or two dichroic filters. FIG. 10A illustrates a configuration of a receiving unit in which the relay unit is configured by a prism and FIG. 10B illustrates a configuration of a receiving unit in which the relay unit is configured by two dichroic filters.

Even though it is not illustrated in the drawing, according to an exemplary embodiment, the receiving unit may further include a substrate to lower the reflectance of light which is incident from the outside. According to various exemplary embodiments, the resonance of some wavelength of the light incident through the substrate may be generated by the ball lens. For example, the substrate may include an anti-reflective coated glass substrate or a plastic substrate to remove reflection of the light.

According to an exemplary embodiment, an optical diffuser may be included after the PV cell to disperse the strong power. According to various exemplary embodiments, in order to expand the FOV of the receiving unit, a micro ball lens array structure in which a plurality of ball lens is disposed in a line may be applied instead of the ball lens.

In the meantime, in FIGS. 2 to 9, a configuration of the transmitter and a configuration of the light source unit which can be configured as a representative exemplary embodiment of the present invention have been illustrated. Accordingly, the scope of the present invention should not be limited by the configurations illustrated in FIGS. 2 to 9. For example, in accordance with a necessity of a designer, the configurations of FIGS. 2 to 9 may be appropriately combined or modified and the scope of the present invention may extend to unit configurations which may be combined in the scope of the general technical level. Accordingly, hereinafter, various exemplary embodiments which may be derived by combining FIGS. 2 to 9 disclosed above will be described.

According to an exemplary embodiment, the transmitter may include a light source unit, a direction control unit, a diffraction grating, and a collimator. According to various exemplary embodiments, the light source unit may include a polarization maintaining optical fiber (polarization maintaining fiber), a semiconductor optical amplifier, an isolator, and a coupler.

According to an exemplary embodiment, the direction control unit receives output information of a light source output from the light source unit to control a direction of the diffraction grating. According to various exemplary embodiments, the direction control unit includes an output information receiver, an analysis unit, and a motor driver. The output information receiver is connected to the light source unit to receive the output information of the light source, the analysis unit analyses the output information, and the motor driver may control the direction of the diffraction grating with the analyzed output information.

According to an exemplary embodiment, the collimator is disposed between the light source unit and the diffraction grating to convert light output from the light source unit into a collimated ray and transmit the collimated ray to the diffraction grating.

According to still another exemplary embodiment, the light source unit of the transmitter may use a single mode fiber (SMF) which has one light propagation mode and has an exact output wavelength because a core diameter is extremely small, instead of the polarization maintaining fiber. According to various exemplary embodiments, a polarization control unit may be formed at an input end and an output end of the semiconductor optical amplifier so that light moving in the single mode fiber maintains the polarization.

According to still another exemplary embodiment, the transmitter may be configured only by the light source unit, the diffraction grating, and the collimator without having the direction control unit.

According to still another exemplary embodiment, the structure of the transmitter may have a structure in which a plurality of semiconductor optical amplifiers included in the light source unit is connected in parallel and the coupler is disposed at a node of the input/output ends of the plurality of semiconductor optical amplifiers.

According to still another exemplary embodiment, the transmitter further includes a direction changing unit. The direction changing unit corresponds to a spatial light modulator (SLM), a digital micromirror device (DMD), an MEMS mirror, or a plurality of small mirrors and is disposed at the output end of the diffraction grating to convert a direction of the light output from the diffraction grating by being controlled by the direction control unit.

According to still another exemplary embodiment, the transmitter may be configured only by the light source unit, the diffraction grating, the collimator, and the light divider without having the direction control unit.

According to still another exemplary embodiment, in the transmitter, the direction control unit may control the direction changing unit rather than the diffraction grating.

According to still another exemplary embodiment, the transmitter may include a width expansion unit and a telescope. According to various exemplary embodiments, the width expansion unit includes a collimator, a polarization film, and a beam expander to expand a width of light to reflect light to the maximum before the light output from the light source unit is input to the diffraction grating.

According to an exemplary embodiment, the collimator forms the light transmitted from the light source unit to be a collimated ray, the polarization film adjusts the polarization of light which is distorted on the space, and the beam expander may expand a width of light which maintains the polarization with the collimated ray. According to various exemplary embodiments, if the magnitude of the light incident to the receiving unit is not sufficiently large, it is difficult for the light to enter the optical path so that in order to reflect the beam as much as possible, the width expansion unit may use the beam expander with a magnification of five times to increase the width of the passed beam to 8.68 mm.

According to an exemplary embodiment, the light source unit may include a circulator instead of the coupler. According to various exemplary embodiments, the circulator may guide the light with a 99:1 tap coupler before light from an output port of the semiconductor optical amplifier goes to the collimator in a free space.

According to still another exemplary embodiment, the transmitter may include a light source unit, a width expansion unit, and a telescope.

According to still another exemplary embodiment, the transmitter may include a width expansion unit, a telescope, a diffraction grating, and a light source unit.

According to still another exemplary embodiment, the transmitter may include a width expansion unit, a telescope, a diffraction grating, a light source unit, and a direction control unit.

According to still another exemplary embodiment, the transmitter may apply a bidirectional optical fiber to the light source unit. To be more specific, the light source unit in the present exemplary embodiment includes a bidirectional optical fiber, a coupler, a semiconductor optical amplifier, and a polarization control unit. The bidirectional optical fiber bidirectionally generates resonance for the incident light to amplify an optical energy.

According to still another exemplary embodiment, the transmitter may transmit light to the receiving unit using a reflector in a free space, without using the optical fiber. To be more specific, the light source unit may include a reflector, a semiconductor optical amplifier, and a collimator and the reflector reflects light incident on the free space and increases the energy of light through a process that the resonance is generated. According to various exemplary embodiments, the semiconductor optical amplifier may provide a broadband gain spectrum with a signal gain for light which is reflected from the reflector to be incident. In the meantime, the collimator is disposed between the reflector and the semiconductor optical amplifier to change the output light into a collimated ray.

According to another exemplary embodiment, the structure of the transmitter may have a structure in which a plurality of semiconductor optical amplifiers included in the light source unit is connected in parallel and the coupler is disposed at a node of the input/output ends of the plurality of semiconductor optical amplifiers.

According to an exemplary embodiment, the light is transmitted to the receiving unit using a light transfer mirror instead of the diffraction grating to optically charge the corresponding receiving unit. According to various exemplary embodiments, when the diffraction grating is used, a plurality of receiving units may be simultaneously charged with multi wavelengths, but an amount of power which is charged in the receiving unit per time may be small. In contrast, when the light transfer mirror is used, one receiving unit may be intensively charged for a short time so that the amount of power charged in the receiving unit per time may be large.

According to an exemplary embodiment, when a transmitter according to the present invention is installed on a ceiling of a specific space as a light source and light source with divided wavelengths is downwardly transmitted from the corresponding transmitter, a receiving unit installed in a robot cleaner, a cellular phone of a customer, or an alarm bell in a corresponding space receives the light and converts an energy of the light in which resonance is generated into an electric energy to charge devices equipped with the receiving unit therein.

According to an exemplary embodiment, the transmitter divides the wavelength of the laser beam and transmits the light with an energy increased by the resonance to the receiving unit. To be more specific, the light source unit of the transmitter is applied with a current to generate light. According to various exemplary embodiments, the light source unit uses a bidirectional semiconductor optical amplifier (SOA) with a central wavelength of 1033.6 nm and a full width at half maximum of 21.9 nm so that a current of 800 mA is applied to the semiconductor optical amplifier to generate light and amplify a wavelength.

According to an exemplary embodiment, the light source unit of the transmitter increases the energy of the light through the resonance of the incident light. According to various exemplary embodiments, the semiconductor optical amplifier of the light source unit may increase a gain of the light.

According to an exemplary embodiment, the semiconductor optical amplifier which generates light has a characteristic in that only a wavelength in a polarized state is amplified so that the light source unit may adjust the polarization with a polarization controller. According to various exemplary embodiments, the diffraction grating of the transmitter may divide light with increased gain in the light source unit into wavelengths in an SOA light source wavelength range on the space.

According to an exemplary embodiment, when a wavelength dividing method is a 1D division type, one diffraction grating is used, when a wavelength dividing method is a 2D division type, two diffraction gratins are used to divide the wavelength or one diffraction grating and a virtually imaged phase array are used to divide the wavelength.

According to an exemplary embodiment, in order to transmit light to a direction where a receiving unit included in various mobile devices or IoT sensors which need to be charged is located, the direction control unit of the transmitter controls a direction of the diffraction grating or the direction changing unit located at an output end of the diffraction grating to control the direction of light. According to various exemplary embodiments, in the case of the 1D division, the direction control of the diffraction grating by the direction control unit may be additionally applied while using one diffraction grating.

According to an exemplary embodiment, in the case of the 2D division, the virtually imaged phase array (VIPA) and one diffraction grating are used to apply the direction control of the diffraction grating by the direction control unit in addition to a state that the wavelength division is implemented.

According to an exemplary embodiment, the receiving unit receives light transmitted from the transmitter and converts energy of some light among the received light into an electric energy to charge the devices. To be more specific, a retro-reflector of the receiving unit reflects the incident light at the same angle and passes some of the incident light to the back.

According to an exemplary embodiment, the energy converting unit of the receiving unit may include a solar cell or a photovoltaic cell which detects light to detect light which passes through the retro-reflector without being reflected and then convert the energy of the detected light into an electric energy. According to various exemplary embodiments, the energy converting unit may charge various devices equipped with the receiving unit therein with the converted electric energy.

According to an exemplary embodiment, the present invention may be used for a drone charging field. For example, the transmitter disclosed in the present invention may be applied to a drone which provides a charging power and the receiving unit disclosed in the present invention may be applied to a drone which requires charging. That is, a drone corresponding to the receiving unit converts energy of some light among light transmitted from a drone corresponding to the transmitter into an electric energy to be charged.

Although the exemplary embodiment of the present disclosure has been described above, the present disclosure may be modified in various forms. Further, it is understood that those skilled in the art may perform various modifications and changes without departing from the claims of the present disclosure.

The invention claimed is:

1. A wireless optical charging system, comprising:
 a transmitter which transmits a wireless optical charging light source (optical source) beam as light with an energy increased by resonance; and
 a receiving unit which receives light transmitted from the transmitter and converts an energy for some light among the received light into an electric energy to charge devices,
 wherein the energy of light increases due to the resonance that occurs between the transmitter and the receiving unit due to the light reflected from the receiving unit to the transmitter,
 wherein the transmitter includes:
 a light source unit;
 a diffraction grating, a prism, or an arrayed waveguide grating which divides light received from the light source unit into wavelengths in a predetermined range to output the light onto a space; and
 a collimator which is disposed between the light source unit and any one of the diffraction grating, the prism, and the arrayed waveguide grating to convert light output from the light source unit into a collimated ray.

2. The wireless optical charging system of claim 1, wherein the transmitter further includes:
 a direction control unit which receives output information of light output from the light source unit to control a direction of the diffraction grating.

3. The wireless optical charging system of claim 2, wherein the transmitter further includes:
 a direction changing unit which is disposed at an output end of the diffraction grating to convert a direction of light output from the diffraction grating by being controlled by the direction control unit instead of the diffraction grating.

4. A wireless optical charging system, comprising:
 a transmitter which transmits a wireless optical charging light source (optical source) beam as light with an energy increased by resonance; and
 a receiving unit which receives light transmitted from the transmitter and converts an energy for some light among the received light into an electric energy to charge devices,
 wherein the energy of light increases due to the resonance that occurs between the transmitter and the receiving unit due to the light reflected from the receiving unit to the transmitter,
 wherein the transmitter includes:
 a light source unit;
 a width expansion unit which expands a width of light in order to increase reflectance of light which is incident into a retro-reflector of a receiver before light output from the light source unit is input to a diffraction grating;
 a diffraction grating which divides light received from the width expansion unit into wavelengths in a predetermined range to output the light onto a space; and
 a telescope which is formed at an output end of the diffraction grating to expand a FOV.

5. The wireless optical charging system of claim 4, wherein the telescope includes a plurality of telescopes and some of the plurality of telescopes is configured to be disposed in parallel.

6. The wireless optical charging system of claim 4, wherein the light source unit includes:
 a polarization maintaining optical fiber which maintains polarization of light;
 a semiconductor optical amplifier which is formed on a path of the polarization maintaining optical fiber to provide a broadband gain spectrum having a signal gain for the light;
 an isolator which transmits light only in one direction; and
 a coupler which receives a power from the collimator and outputs a broadband light source from the semiconductor optical amplifier to the diffraction grating.

7. The wireless optical charging system of claim 1, wherein the light source unit includes:
- a single mode optical fiber having one light propagation mode;
- a semiconductor optical amplifier which is formed on the single mode optical fiber path to provide a broadband gain spectrum having a signal gain for the light;
- an isolator which transmits light only in one direction;
- a polarization control unit which is formed at an input end and an output end of the semiconductor optical amplifier to maintain polarization of light; and
- a coupler which receives a power from the collimator and outputs a broadband light source from the semiconductor optical amplifier to the diffraction grating.

8. The wireless optical charging system of claim 3, wherein the light source unit includes:
- a single mode optical fiber having one light propagation mode;
- an optical fiber laser which is formed on a path of the single mode optical fiber so that an output is adjustable to output light in a broadband;
- a laser pump which adds light of an external source to the single mode optical fiber;
- a WDM coupler which couples a wavelength to light added from the laser pump and light of the single mode optical fiber;
- an isolator which transmits light only in one direction;
- a polarization control unit which is formed at an input end and an output end of the optical fiber laser to maintain polarization of light; and
- a coupler which receives a power from the collimator and outputs a broadband light source from the optical fiber laser to the diffraction grating.

9. The wireless optical charging system of claim 1, wherein the light source unit includes:
- a broadband pass filter which increases an optical signal to noise ratio (OSNR) of an optical signal incident by filtering light incident to the light source unit.

10. The wireless optical charging system of claim 1, wherein the transmitter further includes:
- a light splitter which is disposed at an output end of the light source unit to split light incident from the light source unit into two and transmit the light to the direction control unit and the diffraction grating, and
the light source unit includes:
- a plurality of direction switching mirrors which switches a moving direction of light to form a moving path of light;
- a semiconductor optical amplifier which is formed on the moving path to provide a broadband gain spectrum having a signal gain for the light;
- an isolator which transmits light only in one direction of the moving path; and
- a collimator which is disposed between the semiconductor optical amplifier and the isolator to convert light output from the semiconductor optical amplifier into a collimated ray.

11. The wireless optical charging system of claim 4, wherein the light source unit includes:
- a single mode optical fiber having one light propagation mode;
- a semiconductor optical amplifier which is formed on a path of the single mode optical fiber to provide a broadband gain spectrum having a signal gain for the light;
- a polarization control unit which is formed at an input end and an output end of the semiconductor optical amplifier to maintain polarization of light; and
- a circulator which guides light to a tap coupler before the light output from an output port of the semiconductor optical amplifier goes to a collimator in a free space.

12. The wireless optical charging system of claim 1, wherein the light source unit includes:
- a bidirectional optical fiber in which resonance is bidirectionally performed;
- a coupler which outputs light moving in the bidirectional optical fiber at a predetermined ratio;
- a semiconductor optical amplifier which is formed at an output end of the coupler to provide a broadband gain spectrum having a signal gain for the light; and
- a polarization control unit which is formed on the path of the bidirectional optical fiber and formed at an output end of the semiconductor optical amplifier to maintain polarization of light.

13. The wireless optical charging system of claim 1, wherein the light source unit includes:
- a reflector on a free space which reflects incident light and increases an energy of light through a process of performing resonance;
- a semiconductor optical amplifier which provides a broadband gain spectrum having a signal gain for light which is reflected from the reflector to be incident; and
- a collimator which is disposed between the reflector and the semiconductor optical amplifier to convert output light into a collimated ray.

14. The wireless optical charging system of claim 13, wherein a plurality of semiconductor optical amplifiers is connected in parallel and couplers are disposed at nodes of an input end and an output end of the plurality of semiconductor optical amplifiers.

15. The wireless optical charging system of claim 4, wherein the width expansion unit includes:
- a collimator which forms light transmitted from the light source unit as a collimated ray;
- a polarization film which adjusts polarization of light which is distorted on the space while being formed as a collimated ray by the collimator; and
- a beam expander which expands a width of light which maintains polarization as the collimated ray.

16. The wireless optical charging system of claim 1, wherein the receiving unit includes:
- a retro-reflector which reflects incident light at the same angle and is disposed in the form of a cube, and has a pitch formed at a center; and
- an energy converting unit which detects light among the incident light which is not reflected, but passes through the pitch at the center to convert the light into an electric energy.

17. The wireless optical charging system of claim 1, wherein the receiving unit includes:
- a broadband pass filter which increases an optical signal to noise ratio (OSNR) of an optical signal incident by filtering light incident to the receiving unit.

18. The wireless optical charging system of claim 1, wherein the receiving unit includes:
- a substrate which lowers reflectance of light which is incident to the receiving unit;
- a spherical ball lens which generates resonance on some wavelengths of light which is incident through the substrate;
- an optical diffuser which uniformly spatially disperses the light to be incident from the spherical ball lens; and a photovoltaic cell (PV cell) in which the converted electric energy is charged.

19. The wireless optical charging system of claim 1, wherein the receiving unit includes:
an image sensor which is related to capturing of an image;
a spherical ball lens which generates resonance on some wavelengths of incident light; and
a relay unit which selectively transmits light incident to the receiving unit toward the image sensor or the ball lens, and
the receiving unit includes a portable terminal which is capable of photographing an image.

20. A wireless optical charging system, comprising:
a transmitter which transmits a wireless optical charging light source (optical source) beam as light with an energy increased by resonance; and
a receiving unit which receives light transmitted from the transmitter and converts an energy for some light among the received light into an electric energy to charge devices,
wherein the energy of light increases due to the resonance that occurs between the transmitter and the receiving unit due to the light reflected from the receiving unit to the transmitter,
wherein the transmitter includes:
a light source unit;
a light transfer mirror which transmits light received from the light source unit to the receiving unit; and
a collimator which is disposed between the light source unit and the light transfer mirror to convert light output from the light source unit into a collimated ray.

21. The wireless optical charging system of claim 1, wherein the transmitter further includes:
a receiving unit detecting module which detects the receiving unit which receives light generated from the light source unit; and
a direction control unit which controls a direction of the light transfer mirror.

22. The wireless optical charging system of claim 21, wherein the receiving unit detecting module includes:
a photographing unit which photographs a space;
a receiving unit detecting unit which detects the receiving unit with LED light of the receiving unit (200) from an image photographed by the photographing unit in accordance with the driving; and
a tracking signal generating unit which generates a tracking signal to allow the light transfer mirror by being controlled by the direction control unit to track a receiving unit detected by the unit detecting unit to transmit light.

* * * * *